(12) United States Patent
Craninckx et al.

(10) Patent No.: US 6,556,093 B2
(45) Date of Patent: Apr. 29, 2003

(54) VOLTAGE CONTROLLED OSCILLATOR WITH AUTOMATIC CENTER FREQUENCY CALIBRATION

(75) Inventors: Jan Frans Lucien Craninckx, Boutersem (BE); Mark Maria Albert Ingels, Herent (BE); Frank Nico Lieven Op't Eynde, Wilsele (BE); Joannes Mathilda Josephus Sevenhans, Brasschaat (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/950,803

(22) Filed: Sep. 13, 2001

(65) Prior Publication Data

US 2002/0033741 A1 Mar. 21, 2002

(30) Foreign Application Priority Data

Sep. 15, 2000 (EP) .............................. 00402564

(51) Int. Cl.[7] .................................. H03B 5/00
(52) U.S. Cl. ..................... 331/117 R; 331/16
(58) Field of Search ....................... 331/117 R, 117 FE, 331/16, 177 V

(56) References Cited

U.S. PATENT DOCUMENTS

| | | | | |
|---|---|---|---|---|
| 4,573,025 A | * | 2/1986 | McKinzie, III | 331/117 R |
| 4,855,688 A | * | 8/1989 | Douziech et al. | 331/8 |
| 4,941,156 A | * | 7/1990 | Stern et al. | 331/179 |
| 5,117,206 A | * | 5/1992 | Imamura | 331/158 |
| 5,625,325 A | * | 4/1997 | Rotzoll et al. | 331/16 |
| 5,648,744 A | * | 7/1997 | Prakash et al. | 331/11 |
| 5,686,864 A | | 11/1997 | Martin et al. | 331/1 A |
| 6,091,304 A | | 7/2000 | Harrer | 331/10 |
| 6,114,920 A | | 9/2000 | Moon et al. | 331/179 |
| 6,133,797 A | * | 10/2000 | Lovelace et al. | 331/17 |

FOREIGN PATENT DOCUMENTS

| | | |
|---|---|---|
| EP | 0 944 171 A1 | 9/1999 |
| GB | 2 120 478 A | 11/1983 |
| GB | 2 337 382 A | 11/1999 |
| WO | WO 00/14880 | 3/2000 |

* cited by examiner

*Primary Examiner*—Tuan T. Lam
(74) *Attorney, Agent, or Firm*—Sughrue Mion, PLLC

(57) ABSTRACT

A voltage controlled oscillator with automatic center frequency calibration. The frequency range of the oscillator is increased by switchable capacitor circuits which add or remove extra capacitors in parallel with the variable capacitor of the resonant circuit. Different voltage versus frequency characteristics are obtained. The switchable capacitor circuits are controlled by a detection circuit that sends a reset pulse to a feedback circuit of the VCO when a control voltage from the feedback circuit reaches predetermined low or high voltage limits of the characteristics. Upon reception of the reset pulse, the feedback circuit changes the control voltage from the reached limit into an intermediate voltage between the low and high voltage limits. The control voltage is reset in the middle of a voltage versus frequency characteristic onto which the output frequency is also centered. The VCO includes a selection circuit adapted to immediately change the value of the control voltage.

10 Claims, 1 Drawing Sheet

VOLTAGE CONTROLLED OSCILLATOR WITH AUTOMATIC CENTER FREQUENCY CALIBRATION

BACKGROUND OF THE INVENTION

The present invention relates to a voltage controlled oscillator including an oscillator circuit with a control input, an output terminal and a variable capacitor, said oscillator circuit being adapted to provide, at said output terminal, an output signal having a frequency that is a function of the value of said variable capacitor, said value being controlled by a control voltage applied to said control input.

Such a voltage controlled oscillator is already known in the art. It generally forms part of a Phase Locked Loop [PLL] arrangement wherein the frequency of the output signal has to be selected within a relatively large frequency range. This is for instance the case when the voltage controlled oscillator is used in mobile telecommunication systems and if different transmission protocols, such as the known Global System for Mobile communications [GSM] at 900 MHz and Digital Enhanced Cordless Telecommunications [DECT] or Digital Crossconnect System [DCS] in the 1,800 MHz frequency band, have to be covered by a same circuit. Since the frequency is dependent of the control voltage, the latter must then also be able to vary within a relatively large voltage range.

Furthermore, due to variations in the processing technology, the frequency of the output signal may shift, for a same control or tuning voltage, from the desired one by a large amount. Here again, a solution of using a large tuning range requires a high supply voltage and/or an abrupt variable capacitor or "varicap". A large tuning range results in a large sensitivity of the VCO, which severely influences the surrounding parts of the PLL arrangement.

The trend is now however to reduce the supply voltage in order to reduce accordingly the production cost. Low supply voltage means a reduction of the number of batteries and allows using "deep submicron technology" that permits to reduce the production cost but that can not accept high supply voltages because of risks of break-down.

A problem rising with the reduction of the supply voltage is that a single voltage controlled oscillator may then no longer reach the limits of the requested frequency range.

A possible solution should be to integrate two VCOs in a same circuit. However, such a solution is avoided because of the relatively high cost of this component.

Another possible solution is to design and fabricate several VCOs with "center" frequencies shifted by a certain amount. A center frequency is the frequency at which the VCO should normally operate and that preferably corresponds to a control voltage having an average value, i.e. in the middle of the supply voltage range. Only the VCOs having the correct frequency, under the actual technology characteristics, should then be selected and activated. This also results in an expensive and non-efficient process.

It is finally also possible to perform a digital calibration of the center frequency with a factory trimming. However, digital factory calibration is costly and does not cover variations over the products life time.

SUMMARY OF THE INVENTION

An object of the present invention is to provide a voltage controlled oscillator of the known type but adapted to operate with a relatively low power supply, while allowing a large operational frequency range and keeping the production cost low.

According to the invention, this object is achieved due to the fact that said voltage control oscillator further includes calibration means and switchable capacitor means which comprises switches and capacitors, said calibration means comprising comparator means coupled to a detection circuit, that said comparator means has a first input to which said control voltage is applied, at least a second input to which a predetermined reference voltage is applied, and an output connected to a level input of said detection circuit, that said detection circuit has a control output coupled to switch control inputs of the switches of said switchable capacitor means, said switches being adapted to connect/disconnect, in parallel to said variable capacitor, a capacitor of said switchable capacitor means, that said detection circuit is adapted to activate a control signal if a signal received at said level input indicates that said control voltage has reached said predetermined reference voltage, and that said detection circuit is further adapted to provide said activated control signal at said control output in order to control the switches of said switchable capacitor means.

In this way, when the control voltage reaches the predetermined reference voltage, the fact of adding or removing a capacitor in parallel with the variable capacitor of the oscillator circuit makes the frequency to jump towards another control voltage versus frequency characteristic. As a result, in function of the number of capacitors branched in parallel with the variable capacitor of the oscillator circuit, different frequencies may be obtained for a same control voltage. This allows to increasing the frequency range of a single VCO at relatively low cost and is especially useful in low power supply applications.

Another characterizing embodiment of the present invention is that said voltage control oscillator further includes a feedback circuit having a feedback input to which said output terminal is connected and a feedback output at which said feedback circuit is adapted to provide said control voltage, that said feedback circuit further has a feedback control input to which a reset output of said detection circuit is connected, said detection circuit being adapted to apply a reset pulse to said reset output when said control signal is activated, and that said feedback circuit is adapted to provide, at said feedback output, said control voltage as a function of the frequency of a signal at said feedback input when no reset pulse is received from said detection circuit, and to provide said control voltage equal to a predetermined middle reference voltage when a reset pulse is received from said detection circuit.

When the control voltage changes, say increases, the frequency of the output signal also increases according to a control voltage versus frequency characteristic of the VCO. When the control voltage reaches the predetermined reference voltage, the control signal is activated by the detection circuit and causes the frequency to jump to another control voltage versus frequency characteristic, i.e. to another frequency value. This new frequency value is then generally higher than the requested frequency. This is for instance the case where the control voltage is used for fine-tuning purposes. As a consequence, the control voltage, being then anyway to high and not allowed increasing anymore, needs to be decreased to obtain the correct frequency value. The detection circuit applying a reset pulse to the reset output when the control signal is activated performs this. This forces the feedback circuit to provide a control voltage equal to the predetermined middle reference voltage. This new control voltage is lower than the previous one so that it may again increase thereby increasing the frequency of the output signal.

Preferably, said predetermined middle reference voltage has an intermediate value between said predetermined low reference voltage and said predetermined high reference voltage.

The predetermined middle reference voltage is thus generally a voltage in the middle of the supply voltage range. This allows the frequency to be changed in both directions, i.e. up or down, starting from an average value.

Also another characterizing embodiment of the present invention is that said voltage control oscillator further includes selection means having a first selection input to which said control voltage is applied, a second selection input to which said predetermined middle reference voltage is applied, a selection output connected to the control input of said oscillator circuit, and a selection control input to which the reset output of said detection circuit is connected, and that said selection means is adapted to connect said first selection input to said selection output if no reset pulse is received at said selection control input, and to connect said second selection input to said selection output if said reset pulse is received.

This improves the speed of the transfer from one characteristic to another with a reduced frequency jump during the change of the control voltage from the predetermined reference voltage to the predetermined middle reference voltage by the feedback circuit under control of the activated control signal. This is also useful during a startup phase of the VCO. The VCO then starts operating with a control voltage in the middle of the supply voltage range. This is called "automatic center frequency calibration" and allows the control voltage to be modified for a same amount up and down from the middle or center frequency.

The present invention also relates to a method to adjust a control voltage of a voltage controlled oscillator wherein the frequency of an output signal is a function of said control voltage, said method comprising the step of applying said control voltage to a variable capacitor of an oscillator circuit.

Such a method is already known in the art and is for instance used in the known VCOs mentioned above. If the method is so used, the same problems as described above will arise and no suitable solution is known.

Another object of the present invention is to provide a method adapted to operate a VCO with a relatively low power supply, while allowing a large operational frequency range and keeping the production cost low.

According to the invention, this object is achieved due to the fact that the present method further comprises steps of comparing said control voltage with a predetermined reference voltage, and of controlling the coupling of a capacitor in parallel to said variable capacitor when said control voltage reaches said predetermined reference voltage.

In this way, when the control voltage reaches the predetermined reference voltage, the fact of coupling, i.e. adding or removing, a capacitor in parallel with the variable capacitor of the oscillator circuit makes the frequency to jump to another value. As a result, different frequencies may be obtained for a same control voltage and a large frequency range may be achieved with a reduced voltage range for the control voltage.

Another characterizing embodiment of the present invention is that the method further comprises a step of resetting said control voltage to a predetermined middle reference voltage when said predetermined reference voltage is reached.

When the control voltage changes, say decreases, until reaching the predetermined reference voltage, the frequency jumps to another value. This new frequency value is lower but corresponds to a control voltage that is not allowed to decrease anymore. By resetting the control voltage to the predetermined middle reference voltage which is preferably a voltage in the middle of the supply voltage range, and thus lower than the actual control voltage, the latter may again decrease, thereby allowing again the frequency to be modified in any direction, i.e. higher or lower.

It is to be noted that the present method is particularly suited to be applied in the above VCO according to the invention.

Further characterizing embodiments of the present voltage controlled oscillator, preferably with an automatic center frequency calibration as mentioned above, and of the method to adjust the control voltage thereof are mentioned in the appended claims.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
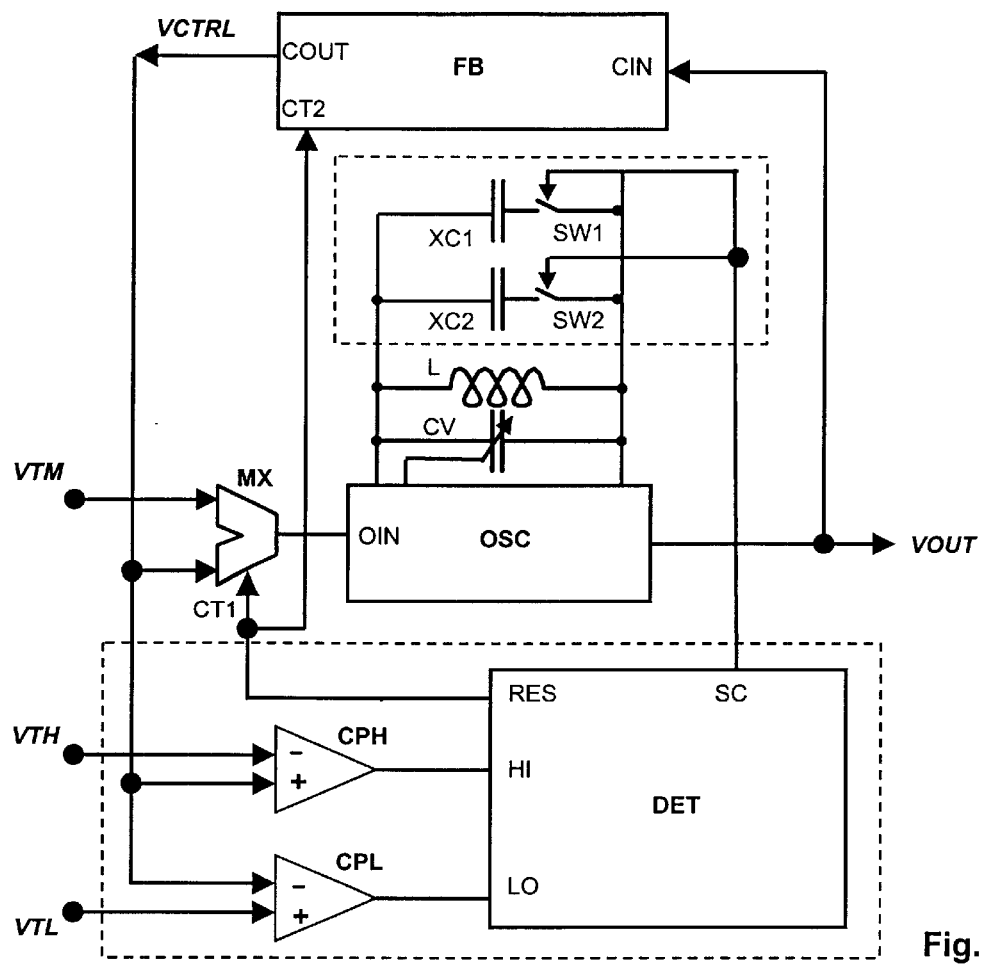
FIG. 1 represents a voltage controlled oscillator with automatic center frequency calibration according to the invention.

The VCO shown at FIG. 1 includes an oscillator circuit OSC having an output terminal VOUT at which a like named output signal is provided. The frequency of the output signal VOUT is determined by a control or tuning voltage VCTRL applied to a control input OIN of the oscillator circuit OSC. To provide the output signal VOUT at a predetermined frequency, the oscillator circuit OSC comprises a resonant circuit formed by the parallel connection of an inductance L and a variable capacitor or "varicap" CV. The value of the variable capacitor is controlled in an analog way by the control voltage VCTRL that is derived from the frequency of the output signal VOUT by a feedback circuit FB, also included in the VCO.

The feedback circuit FB has an input CIN to which the output terminal VOUT is connected and an output COUT at which the control voltage VCTRL is provided as a function of the frequency of the output signal VOUT.

Figure 2:
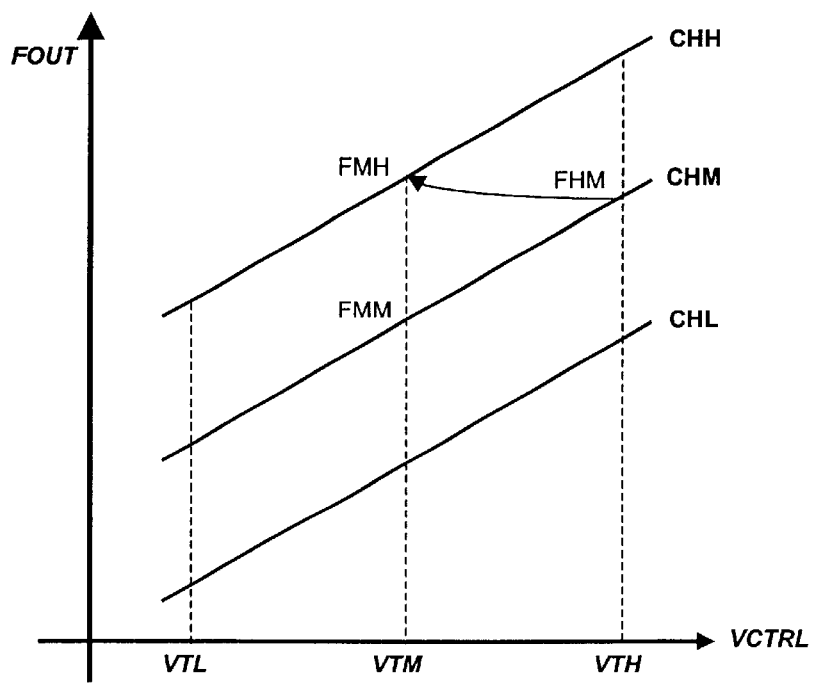
FIG. 2 shows different control voltage versus frequency characteristics of the VCO of FIG. 1.

Some operational characteristics CHL, CHM, CHH of control voltage VCTRL versus frequency FOUT of the output voltage VOUT of the VCO are represented at FIG. 2. These characteristics correspond to different capacitor values of the resonant circuit of OSC. Therein appears that the control voltage VCTRL is allowed to vary within predetermined voltage range from a low reference voltage VTL up to a high reference voltage VTH. According to the value of the capacitor, the frequency FOUT then varies according to one of the represented characteristics CHL, CHM or CHH as will be explained in more detail below.

In order to increase the frequency range wherein the frequency FOUT is allowed to vary, without increasing the voltage range wherein the control voltage VCTRL is allowed to be, a calibration circuit is added to the VCO. The calibration circuit includes two comparators CPL and CPH and a detection circuit DET.

On the one hand, the comparator CPL is a low limit comparator comprising a differential amplifier having an inverting input − at which the control voltage VCTRL is applied and a non-inverting input + at which the low reference voltage VTL is applied. An output of the comparator CPL is connected to a low level input LO of the detection circuit DET. On the other hand, the comparator CPH is a high limit comparator also comprising a differential amplifier having a non-inverting input + at which the control voltage VCTRL is applied and an inverting input − at which the low reference voltage VTL is applied. An output of the comparator CPH is connected to a high level input HI of the detection circuit DET.

When the control voltage VCTRL reaches one of the limits of the voltage range, i.e. either the lower limit VTL or the upper limit VTH, a signal is provided at a corresponding level input LO or HI of the detection circuit DET by one of the comparators CPL or CPH respectively. The detection circuit DET then activates a control signal and provides it at a detector control output SC.

This detector control output SC is connected to control inputs of switchable capacitor circuits also included in the VCO. The VCO may be provided with one or more switchable capacitor circuits, two such circuits are shown at FIG. 1. Each switchable capacitor circuit comprises the series connection of a switch SW1, SW2 and a capacitor XC1, XC2. The switchable capacitor circuits are connected in parallel to the resonant circuit of the oscillator circuit OSC. They are thus connected in parallel across the variable capacitor CV.

To further explain the effects of the detection circuit DET and of the switchable capacitor circuits on the operation of the VCO, we will consider that a first switchable capacitor circuit is operational, i.e. with its switch, say SW1, closed, whilst a second switchable capacitor circuit has its switch SW2 open and its capacitor XC2 is thus not operational with respect to the resonant circuit. This situation will correspond the characteristic CHM at FIG. 2.

As long the control voltage remains in a voltage range within the limits of VTL and VTH, no control signal is activated by the detection circuit DET and the oscillator OSC will operate along the characteristic CHM with, as resonant circuit, the parallel connection of the inductance L, the variable capacitor CV and the capacitor XC1.

If, for instance, the control voltage VCTRL increases, the frequency FOUT also increases. When the control voltage VCTRL reaches the high reference voltage VTH corresponding to a frequency FHM of the output signal VOUT, the comparator CPH detects that situation and sent a signal to the high level input HI of the detection circuit DET. In response to this signal, the detection circuit DET activates a control signal at its control output SC in order to close the switch SW2 of the second switchable capacitor circuit. By closing the switch SW2, the second capacitor XC2 becomes connected in parallel to the actual resonant circuit, of which the capacitive value is thereby increased. As a result, the control voltage versus frequency characteristic of the VCO becomes CHH instead of CHM. The frequency is the immediately increased because of the jump from the characteristic CHM to the characteristic CHH.

If, on the contrary, starting again from the characteristic CHM, the control voltage VCTRL decreases, the frequency FOUT also decreases. When the control voltage VCTRL reaches the low reference voltage VTL, the comparator CPL detects that situation and sent a signal to the low level input LO of the detection circuit DET. In response to this signal, the detection circuit DET activates a control signal at its control output SC to open the switch SW1 of the first switchable capacitor circuit. By opening the switch SW1, the first capacitor XC1 becomes disconnected from the actual resonant circuit, of which the capacitive value is thereby decreased since only the variable capacitor VC remains in parallel with the inductance L. As a result, the control voltage versus frequency characteristic of the VCO becomes CHL instead of CHM. The frequency is the immediately decreased because of the jump from the characteristic CHM to the characteristic CHL.

Owing to the two switchable capacitor circuits in parallel over the resonant circuit of the oscillator circuit OSC, the frequency range of FOUT is increased up to limits going from the lowest frequency of the characteristic CHL to the highest frequency of the characteristic CHH instead of remaining within the limits of only one of these characteristics, e.g. CHM.

It is to be noted that after a "digital" jump from one characteristic to another, e.g. from CHM to CHH in case of an increasing control voltage VCTRL, the latter voltage is no longer allowed to increase, but may still decrease, while in case of a decreasing control voltage VCTRL and a digital jump from CHM to CHL, the control voltage VCTRL is no longer allowed to decrease, but may still increase. Furthermore, this digital change of characteristic causes an abrupt jump on the smooth analog frequency progression along a single characteristic, which in some application, such as for instance for fine-tuning, is unwanted.

The present VCO is therefore preferably provided with an automatic center frequency calibration which, by a digital frequency jump resets the control voltage VCTRL in the middle of the allowed voltage range thereby also resetting the frequency FOUT in the middle of the new characteristic.

To this end, the detection circuit DET is provided with a reset output RES whereat a like-named reset pulse is provided when a control signal is activated at the control output SC. The reset output RES is connected to a control input CT2 of the feedback circuit FB. If, for instance, the control voltage VCRTL, moving upwards on the characteristic CHM, has reached the high reference voltage VTH, a reset pulse is sent by the detection circuit DET to the feedback circuit FB via the respective terminals RES and CT2. Upon reception of the reset pulse, the feedback circuit FB changes the control voltage VCTRL, at its output COUT, from the high reference voltage VTH to a middle reference voltage VTM. This middle reference voltage VTM preferably has an intermediate value between the low reference voltage VTL and the high reference voltage VTH. The middle reference voltage VTM is preferably also in the middle of the supply voltage range. Owing to the new control voltage VCTRL being equal to the middle reference voltage VTM on the characteristic CHH, the frequency FOUT of the output signal VOUT has changed from FHM at the upper limit of the characteristic CHM to FMH in the middle of the characteristic CHH. As can be seen at FIG. 2, the frequencies FHM and FMH are chosen to be substantially equal. As a result, the control voltage VCTRL may continue to increase on the characteristic CHH and there is no longer a frequency jump during the increase of VCTRL first on CHM and then on CHH.

This reset of the control voltage VCTRL in the middle of the control voltage versus frequency characteristic of the VCO is called "automatic center frequency calibration". The arrangement comprising the comparators CPL and CPH and the detection circuit DET is therefore also called calibration circuit. The reset of the control voltage VCTRL to an intermediate value VTM further also allows the frequency FOUT to be changed again in both directions, i.e. up or down on the characteristic CHH, starting from the average or middle value FMH.

In order to improve the transition speed of the control voltage VCTRL from a limit value such as VTH to the middle value VTM, and thus to reduce the already small frequency jump from FHM to FMH, a selection circuit MX is added to the VCO. The selection circuit MX has a first input to which the control voltage VCTRL, from the feedback output COUT, is applied, and has a second input to which a middle reference voltage equal to VTM is applied. An output of the selection circuit MX is connected to the control input OIN of the oscillator circuit OSC, and MX is further provided with a control input CT1 to which the reset output RES of the detection circuit DET is connected. By default, i.e. without reset pulse received, the first input of MX is connected to the output thereof, applying so the control voltage VCTRL directly to the control input OIN of the oscillator circuit OSC.

During a change of characteristic, a reset pulse is sent by the detection circuit DET to the control input CT1 of the selection circuit SX. The second input of SX is then selected and the middle reference voltage VTM is then immediately applied to the control input OIN instead of the control voltage VCTRL. As a result, the frequency FOUT of the output signal VOUT is immediately changed from FHM to FMH. The duration of this operation corresponds to the time needed by the feedback circuit FB to change the control voltage VCTRL at its output COUT from VTH to VTL. This is also useful during a startup phase of the VCO. Because of the presence of the selection circuit SX, the VCO always starts operating with a control voltage in the middle of the supply voltage range.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

What is claimed is:

1. A voltage controlled oscillator including an oscillator circuit with a control input, an output terminal and a variable capacitor, said oscillator circuit being adapted to provide, at said output terminal, an output signal having a frequency that is a function of the value of said variable capacitor, said value being controlled by a control voltage applied to said control input, characterized in that said voltage control oscillator further includes calibration means and switchable capacitor means which comprises switches and capacitors, said calibration means comprising comparator means coupled to a detection circuit, in that said comparator means has a first input to which said control voltage is applied, at least a second input to which a predetermined reference voltage is applied, and an output connected to a level input of said detection circuit, in that said detection circuit has a control output coupled to switch control inputs of the switches of said switchable capacitor means, said switches being adapted to connect/disconnect, in parallel to said variable capacitor, a capacitor of said switchable capacitor means, in that said detection circuit is adapted to activate a control signal when a signal received at said level input indicates that said control voltage has reached said predetermined reference voltage, and in that said detection circuit is further adapted to provide said activated control signal at said control output in order to control the switches of said switchable capacitor means, and said detection circuit includes a reset output configured to reset said control voltage.

2. The voltage control oscillator according to claim 1, characterized in that the comparator means of said calibration means includes a first comparator having a first input to which said control voltage is applied, a second input to which a predetermined low reference voltage is applied, and an output connected to a low level input of said detection circuit, in that said comparator means further includes a second comparator having a first input to which said control voltage is applied, a second input to which a predetermined high reference voltage is applied, and an output connected to a high level input of said detection circuit, and in that said detection circuit is adapted to control, via said control output coupled to said switch control inputs, said switchable capacitor means to connect a capacitor in parallel to said variable capacitor when said control signal is activated via said low level input, and to disconnect a capacitor from said variable capacitor when said control signal is activated via said high level input.

3. A voltage control oscillator according to claim 2, characterized in that said voltage control oscillator further includes a feedback circuit having a feedback input to which said output terminal is connected and a feedback output at which said feedback circuit is adapted to provide said control voltage, in that said feedback circuit further has a feedback control input to which said reset output of said detection circuit is connected, said detection circuit being adapted to apply a reset pulse to said reset output when said control signal is activated, and in that said feedback circuit is adapted to provide, at said feedback output, said control voltage as a function of the frequency of a signal at said feedback input when no reset pulse is received from said detection circuit, wherein said control voltage has a value of a predetermined middle reference voltage when a reset pulse is received from said detection circuit.

4. The voltage control oscillator according to the claim 3, characterized in that said predetermined middle reference voltage has an intermediate value between said predetermined low reference voltage and said predetermined high reference voltage.

5. The voltage control oscillator according to claim 3, characterized in that said voltage control oscillator further includes selection means having a first selection input to which said control voltage is applied, a second selection input to which said predetermined middle reference voltage is applied, a selection output connected to the control input of said oscillator circuit, and a selection control input to which the reset output of said detection circuit is connected, and in that said selection means is adapted to connect said first selection input to said selection output when no reset pulse is received at said selection control input, and to connect said second selection input to said selection output when said reset pulse is received.

6. A method to adjust a control voltage of a voltage controlled oscillator wherein the frequency of an output signal is a function of said control voltage, said method comprising the step of applying said control voltage to a variable capacitor of an oscillator circuit, characterized in that said method further comprises steps of comparing said control voltage with a predetermined reference voltage, and of controlling the coupling of a capacitor in parallel to said variable capacitor when said control voltage reaches said predetermined reference voltage, wherein said control voltage is reset in accordance with a reset output generated by a detection circuit.

7. The method according to claim 6, characterized in that said method comprises steps of comparing said control voltage with a predetermined low reference voltage and with a predetermined high reference voltage, connecting of a capacitor in parallel to said variable capacitor when said control voltage reaches said predetermined low reference voltage, and disconnecting a capacitor from said variable capacitor when said control voltage reaches said predetermined high reference voltage.

8. The method according to claim 7, characterized in that said method further comprises a step of resetting said control voltage to a predetermined middle reference voltage when said predetermined reference voltage is reached.

9. The method according to claim 8, characterized in that the frequency of said output signal immediately after the coupling of said capacitor is equal to the frequency of said output signal immediately before the coupling of said capacitor.

10. The method according to the claim 8, characterized in that said predetermined middle reference voltage has an intermediate value between said predetermined low reference voltage and said predetermined high reference voltage.

* * * * *